US006301225B1

(12) United States Patent
Murdock

(10) Patent No.: US 6,301,225 B1
(45) Date of Patent: Oct. 9, 2001

(54) CONFIGURABLE COMMUNICATION APPARATUS THAT PERMITS USE OF UNUSED MULTIPLEXER CHANNELS WHEN OPERATING IN HIGH POWER MODE

(75) Inventor: Gerald T. Murdock, Sunnyvale, CA (US)

(73) Assignee: Space Systems/Loral, Inc., Palo Alto, CA (US)

( * ) Notice: Subject to any disclaimer, the term of this patent is extended or adjusted under 35 U.S.C. 154(b) by 0 days.

(21) Appl. No.: 09/062,548

(22) Filed: Apr. 18, 1998

(51) Int. Cl.[7] .................................................. H04B 7/185
(52) U.S. Cl. .......................... 370/227; 370/228; 370/323; 370/325; 333/101; 455/12.1
(58) Field of Search ..................................... 370/227, 225, 370/228, 217, 218–224, 323, 325, 315, 314; 333/101, 105; 455/12.1, 129

(56) References Cited

U.S. PATENT DOCUMENTS 5,862,462 * 1/1999 Tyner et al. ......................... 455/129
5,978,652 * 11/1999 Burr et al. .......................... 455/12.1
6,020,796 * 2/2000 Collar et al. ......................... 333/101

* cited by examiner

Primary Examiner—Ricky Ngo

(57) ABSTRACT

Redundancy ring communication apparatus having a plurality of communication channels, that comprises normally used and redundant amplifier channels that are interconnected using selectively controllable switches. Pairs of amplifier channels may be selectively coupled together using controllable switches and hybrid couplers. A controller is coupled to each of the switches that selectively sets the switches to (1) route selected signals through independent communication channels, (2) route a selected signal through the pair of amplifier channels to provide a high power output for the selected communication channel, (3) route a selected signal through a redundant communication channel in the event of failure of another communication channel, and (4) route the signal of the normally unused communication channel that is normally amplified by the second amplifier of the paired amplifier channels operating in high power mode through an unused amplifier channel to provide a communication channel for the signal of the normally unused communication channel.

10 Claims, 4 Drawing Sheets

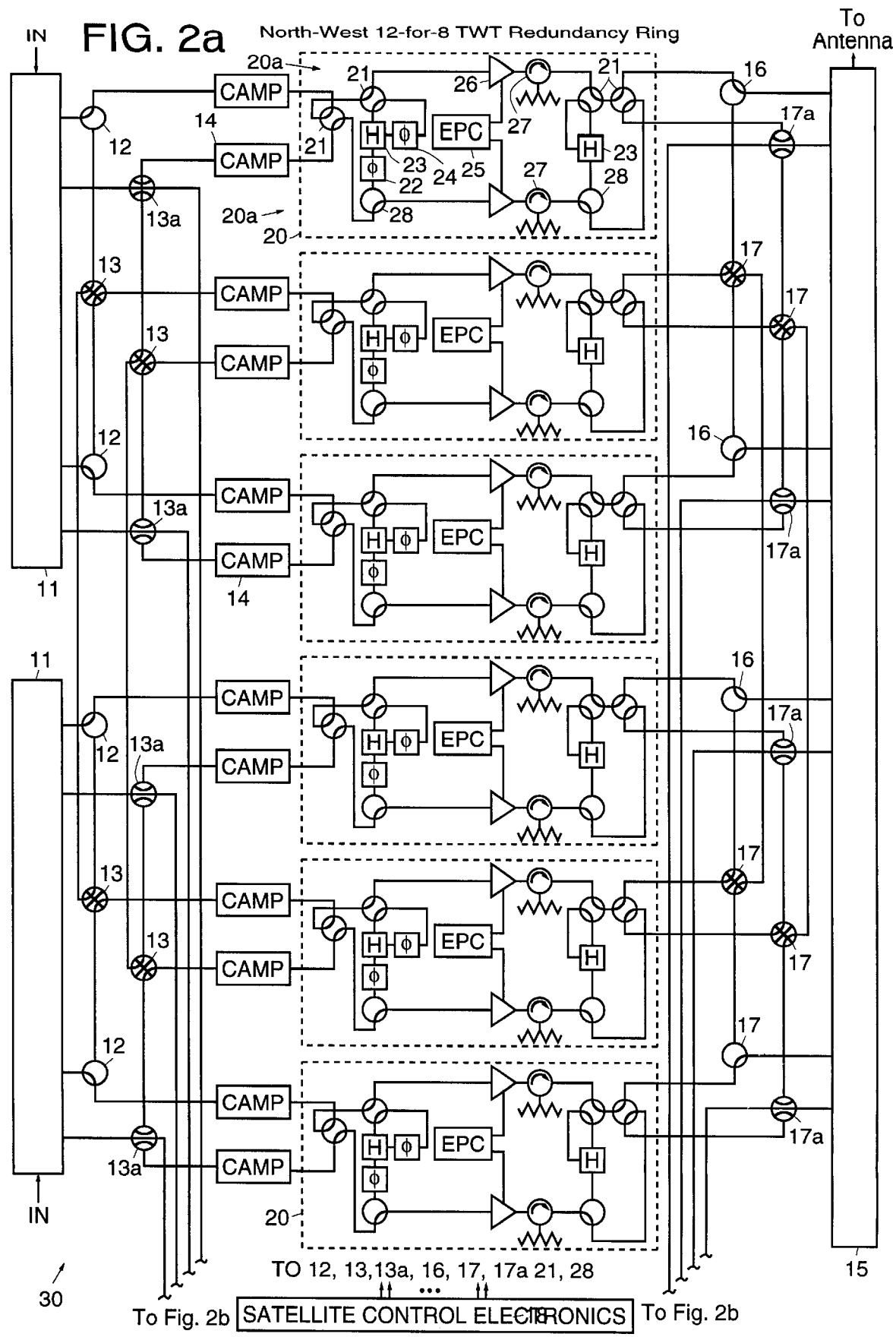

CONFIGURABLE COMMUNICATION APPARATUS THAT PERMITS USE OF UNUSED MULTIPLEXER CHANNELS WHEN OPERATING IN HIGH POWER MODE

BACKGROUND

The present invention relates generally to spacecraft communication apparatus, and more particularly, to amplifier redundancy ring communication apparatus that can be configured to use normally unused multiplexer channels when operating in high power mode.

The assignee of the present invention manufactures and deploys communication satellites that carry communication systems as their payloads. A typical communication system uses two or more separate and independent amplifier channels that each form a redundancy ring.

In an exemplary embodiment, a plurality of single input, multiple output, input multiplexers that are coupled to a multiple input, single output, output multiplexer by means of a set of amplifier channels that form the redundancy ring. Each redundancy ring contains a plurality of amplified communication paths (amplifier channels) that route signals from the outputs of the input multiplexers to the inputs of the output multiplexer.

Within each independent set of amplifier channels forming the redundancy ring, extra amplifier channels are provided that may be used in case of failure of one of the other amplifier channels within that redundancy ring. If an amplifier channel fails, one of the extra amplifier channels is switched into the circuit to replace it.

The amplified communication paths 20a each contain a traveling wave tube amplifier (TWTA), for example. Pairs of traveling wave tube amplifiers may be selectively coupled together to provide for high power operation. Thus, the traveling wave tube amplifiers may be controlled to operate in (1) a single traveling wave tube (TWT) mode and in (2) a high power combined traveling wave tube (TWT) mode using a coupled pair of traveling wave tube amplifiers. When the conventional system is configured to operate in the normal TWT mode, all of the outputs of the input multiplexers are routed to all of the inputs of the output multiplexer. Thus all communication channels are used. However, when the conventional system is configured to operate in the high power combined TWT mode, the communication path for the channel of the "coupled" amplifier is not used. Thus, all available communication channels of the conventional system are not used when it is operated in the high power mode.

The inability to use certain channels when operating in the high power mode is relatively inefficient. Furthermore, it would be desirable to have the option of using unused channels of a given output multiplexer when the high power combined TWT mode has been selected for another channel. It would therefore be desirable to have a communication system that permits the use of the normally unused output multiplexer channels when the system operates in a high power combined TWT mode.

Accordingly, it is an objective of the present invention to provide for communication apparatus that is selectively configurable to provide for the use of normally unused output multiplexer channels when it is operated in high power mode. It is a further objective of the present invention to provide for communication apparatus that uses selectively interconnected amplifier channels of its redundancy rings to permit normally unused output multiplexer channels to be used when the system is configured to operate in high power mode.

SUMMARY OF THE INVENTION

To accomplish the above and other objectives, the present invention provides for improved amplifier redundancy ring communication apparatus. The communication apparatus comprises a plurality of multiple output, input multiplexers and a plurality of multiple input, output multiplexers. Outputs of the input multiplexers are coupled to inputs of the output multiplexers by way of a plurality of amplifier channels. A plurality of redundant amplifier channels are provided that complete the redundancy ring. Each redundancy ring contains a plurality of amplified communication paths (amplifier channels) that route signals from the outputs of the input multiplexers to the inputs of the output multiplexer along with additional amplifier channels that may be used in case of failure of one of the amplifier channels.

As was the case with the conventional communication apparatus discussed in the Background section, pairs of amplifier channels may be selectively coupled together. In particular, the amplifier channels may be configured to operate in a single amplifier mode wherein each amplifier channel operates independently, and in a high power combined amplifier mode wherein both amplifier channels of a pair are coupled together to provide high power output.

The improvement provided by the present invention is that switching circuitry is provided that (1) permit the extra amplifier channels to be switched into the circuit if other amplifier channels fail, as is the case with the prior system, but (2) also provides the capability to switch an unused amplifier channel into the circuit to provide a communication channel between the corresponding output and input of the input and output multiplexers that is normally provided by the "coupled" amplifier channel. The unused amplifier channel that is switched into the circuit is typically the corresponding amplifier channel of the other redundancy ring. However, this need not be the case, in that any of the unused amplifier channels may be switched into the circuit to provide the communication path.

The present invention thus provides the capability to use previously unused multiplexer channels by switching in a single amplifier or combined pair of traveling wave tube amplifiers from a different TWT redundancy ring. The aspect of the present invention provides added flexibility for customers and a simplicity in the design that "backfills" the unused multiplexer channels.

To implement the present invention, outputs of the input multiplexers of each redundancy ring are interconnected together by means of controllable switches. Similarly, inputs of the output multiplexers of each redundancy ring are interconnected together by means of controllable switches. The switches are controlled by means of a controller that selectively activates the switches to interconnect a particular input multiplexer output to the appropriate output multiplexer input, thus providing a communication path therebetween. The arrangement of switches permits controlled selection of the alternative path through any of the unused amplifier channels.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIGS. 2a and 2b illustrate communication apparatus in accordance with the principles of the present invention.

DETAILED DESCRIPTION

Figure 1A:
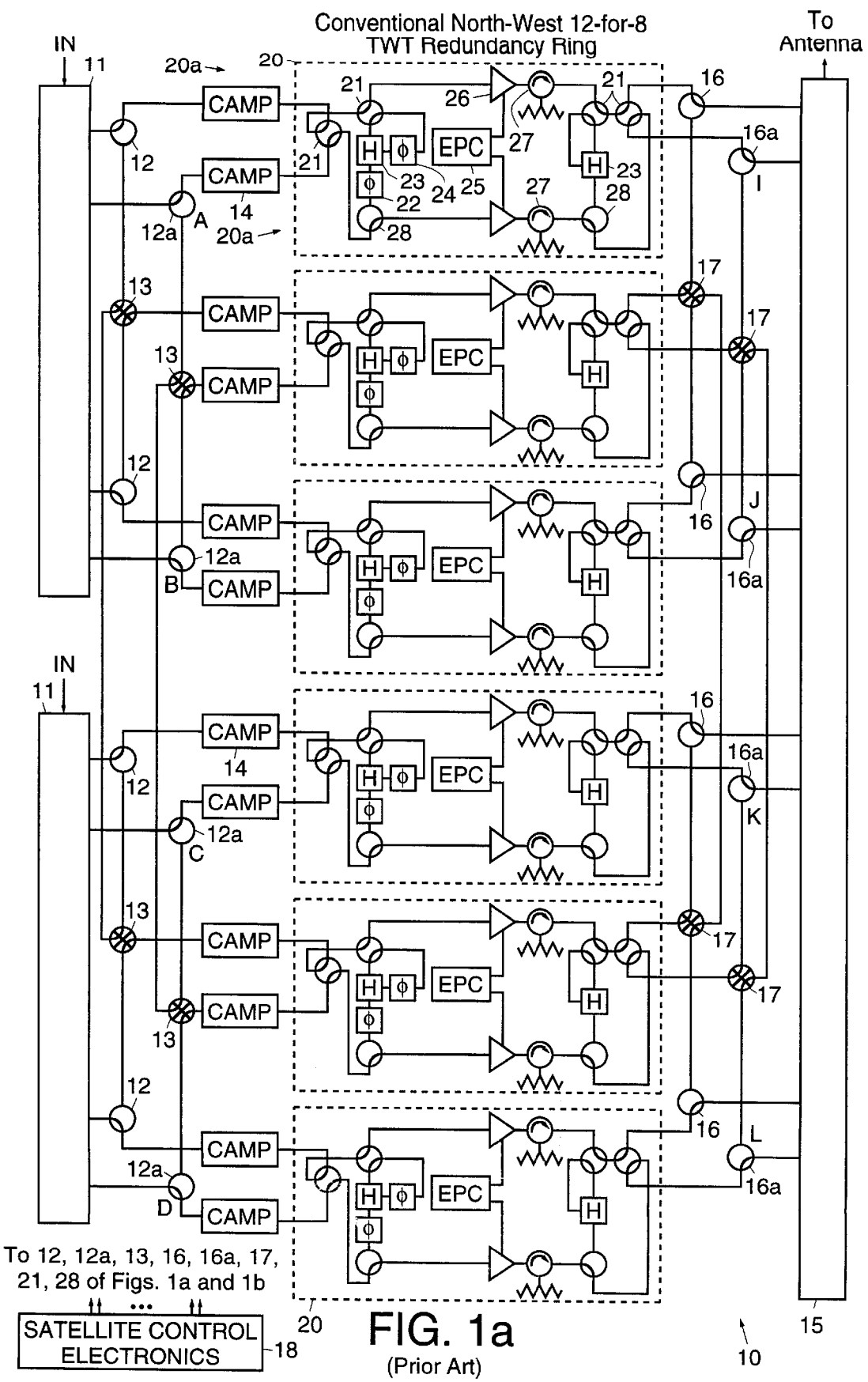
FIGS. 1a and 1b illustrate conventional independent TWT redundancy rings used in spacecraft communication systems heretofore deployed by the assignee of the present invention.
Figure 1B:
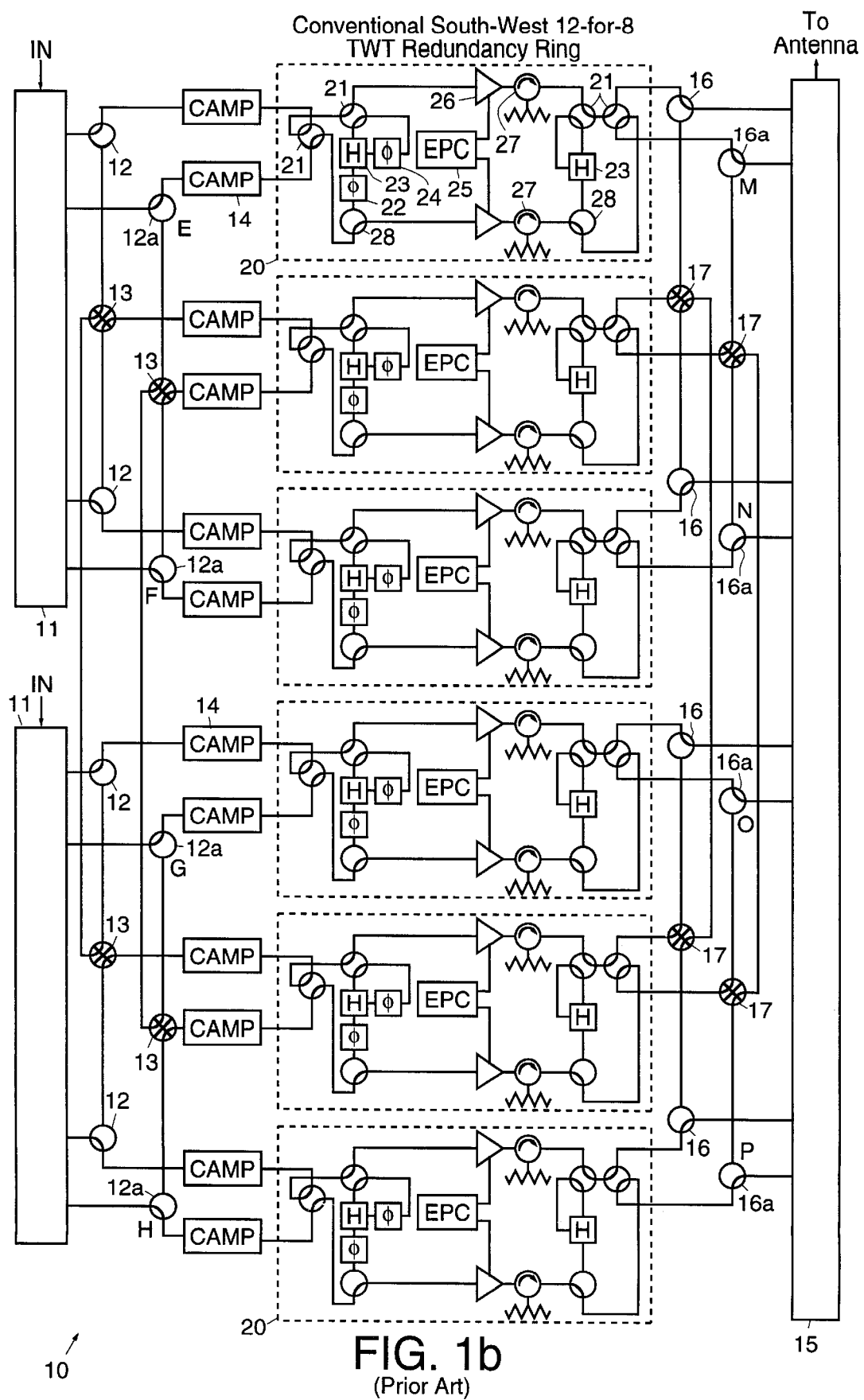

Referring to the drawing figures, FIGS. 1a and 1b illustrate communication apparatus 10 comprising conventional separate traveling wave tube amplifier (TWTA) redundancy rings 10 used in spacecraft communication systems previously deployed by the assignee of the present invention. More specifically, FIGS. 1a and 1b illustrate two conventional and separate 12-for-8 TWTA redundancy rings 10 used to amplify input signals that are supplied to transmit antennas (not shown) for transmission. The redundancy rings 10 are identified as a North-West redundancy ring 10 (FIG. 1a) and a South-West redundancy ring 10 (FIG. 1b). Each redundancy ring 10 comprises a plurality of amplified communication paths 20a or amplifier channels 20a.

The communication apparatus 10 shown in FIG. 1a is substantially the same as that shown in FIG. 1b, so a description of 1a will be provided that describes both circuits. Input signals are applied to inputs of a plurality of single input, multiple output input multiplexers 11 (or to an input of a single input multiplexer 11) which output a plurality of separate output signals at individual outputs of the input multiplexers 11 (corresponding to a plurality of communication paths 20a). Each of the outputs of the input multiplexers 11 are coupled by way of a controllable input switch 12, 12a to a channel amplifier (CAMP) 14. Outputs of the channel amplifiers 14 are routed through individual amplifier channels 20a of the redundancy ring 10 and are coupled by way of controllable output switches 16, 16a to inputs of a multiple input, single output, output multiplexer 15. The output of the output multiplexer 15 is coupled to the transmit antenna (not shown).

Each redundancy ring 10 comprises a plurality of amplified communication paths 20a (amplifier channels 20a) that amplify signals derived from the outputs of the input multiplexers 11 that are coupled to the inputs of the output multiplexer 15. Each of the amplifier channels 20a comprise a traveling wave tube amplifier 26, along with controllable switches 21, 28, input and output hybrid (H) couplers 23, phase shifters ($\phi$) 22, 24, and terminated circulators 27, constructed substantially as shown. A electrical power conditioner (EPC) 25, comprising a high voltage power supply, is coupled to selected pairs of traveling wave tube amplifiers 26. The channel amplifiers 14 are used to set the gain of the signal supplied to the traveling wave tube amplifier 26 disposed in the respective communication path 20a.

A plurality of controllable input redundancy switches 13 are coupled between selected controllable input switches 12, 12a and corresponding channel amplifiers 14 of the redundant amplifier channels 20a. Similarly, a plurality of controllable output redundancy switches 17 are selectively coupled between outputs of the redundant amplifier channels 20a and selected controllable output switches 16, 16a.

Satellite control electronics 18 is provided that operates as a controller and has control lines that are coupled to each of the switches 12, 12a, 13, 16, 16a, 17, 21, 28 and that are used to selectively control or toggle the switches 12, 12a, 13, 16, 16a, 17, 21, 28 to route selected signals through the plurality of amplifier channels 20a.

Thus, each redundancy ring 10 contains extra amplifier channels 20a that may be used in case of failure of another of the amplifier channels 20a in that ring 10. Thus, if an amplifier channel 20a fails, one of the extra amplifier channels 20a may be switched into the circuit to replace it.

The satellite control electronics 18 is used to toggle the switches 12, 12a, 13, 16, 16a, 17, 21, 28 to switch the extra amplifier channels 20a into the circuit.

Pairs of traveling wave tube amplifiers 26 may be selectively coupled together to provide for high power operation. The electrical power conditioner supplies high voltage to the traveling wave tube amplifiers 26. The switch controller 18 selectively switches the input and output switches 12, 12a, 16, 16a to remove the undesired amplifier channel 20a from its normal communication path and couples the output of the amplifiers 26 by way of the switches 21, 28 and hybrid couplers 23 to the other communication path which is combined to produce the high power output.

Thus, when channel 1, for example, is selected for high power mode, the output of the TWT amplifier 26 normally used to support traffic for channel 2 is switched into the output hybrid coupler 23 to provide for high power combining. This provides high output power for channel 1, but leaves channel 2 in the input and output multiplexers 11, 15 unused.

Thus, in the prior system 10, the traveling wave tube amplifiers 26 may be controlled to operate in a normal (low power) mode or in a high power combined mode using coupled traveling wave tube amplifiers 26. When the conventional system 10 is configured to operate in the normal (low power) mode, the outputs of the input multiplexers 11 are routed straight through to the inputs of the output multiplexer 15, and all communication paths 20a are used. However, when the conventional system is configured to operate in the high power mode, the communication path for the channel of the "coupled" amplifier 26 is not used. Consequently, all communication paths 20a are not used when the conventional system 10 is operated in the high power mode.

Figure 2B:
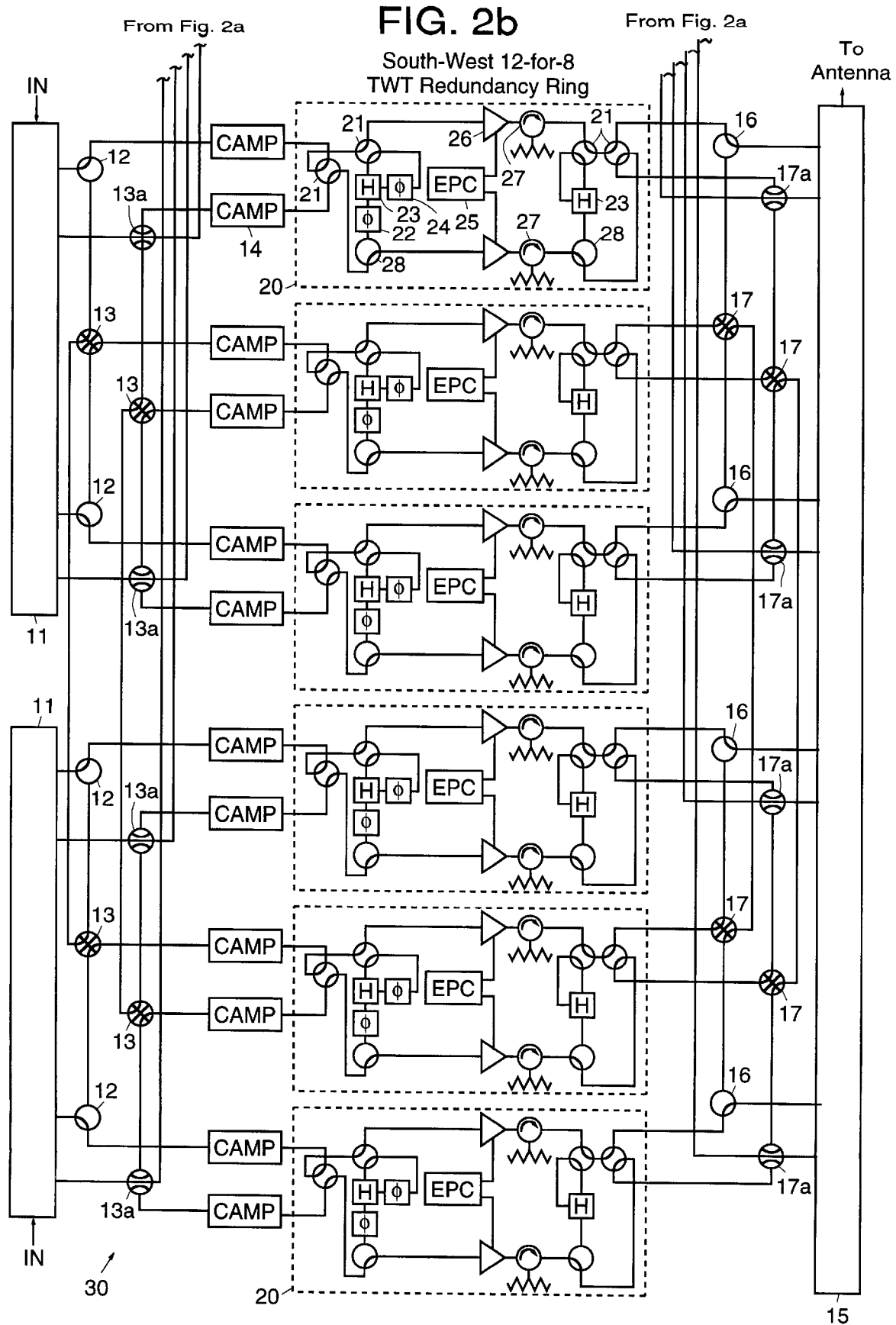

Referring now to FIGS. 2a and 2b, they illustrate improved communication apparatus 30 in accordance with the principles of the present invention. The construction of the apparatus 30 shown in FIGS. 2a and 2b is generally the same as that of FIGS. 1a and 1b, but with certain modifications and will be discussed below. The present apparatus 30 overcomes limitations of the prior apparatus 10 by providing switching circuitry and interconnection paths between amplifier channels 20a of each of the redundancy rings 10. The communication apparatus 30 employs switchably interconnected amplifier channels 20a of separate redundancy rings 10 that permit use of normally unused multiplexer channels when the amplifiers 26 are operated in high power mode.

The communication apparatus 30 comprises a plurality of multiple output, input multiplexers 11 and a plurality of multiple input, output multiplexers 15. Outputs of the input multiplexers 11 are coupled to inputs of the output multiplexers 15 by way of a plurality of amplifier channels 20a. A plurality of redundant amplifier channels 20a are provided that complete the redundancy ring 10. Each redundancy ring 10 has a plurality of amplified communication paths 20a (amplifier channels 20a) that route signals from the outputs of input multiplexers 11 to inputs of an output multiplexer 15 along with additional amplifier channels 20a that may be used in case of failure of one of the amplifier channels 20a.

To implement the present invention, outputs of the input multiplexers 11 of each redundancy ring 10 are interconnected together by means of selectively interconnected and controllable switches 12, 13, 13a. Similarly, inputs of the output multiplexers 15 of each redundancy ring 10 are interconnected together by means of selectively interconnected and controllable switches 16, 17, 17a. Certain of the switches 13a operate to couple signals between the redundancy rings 10. The switches 12, 13, 13a 16, 17, 17a are controlled by means of spacecraft control electronics 18 (or controller 18) that selectively activates the switches 12, 13, 13a, 16, 17, 17a to interconnect a particular output of an input multiplexer 11 to the appropriate input of an output multiplexer 15, thus providing a communication path therebetween. The arrangement of switches 12, 13, 13a, 16, 17, 17a permits controlled selection of alternative paths through any of the unused amplifier channels 20a.

Pairs of amplifier channels 20a may be selectively coupled together. In particular, the amplifier channels 20a may be configured to operate in a normal amplifier mode wherein each amplifier channel 20a operates independently, and in a high power combined amplifier mode wherein both amplifier channels 20a of a pair are coupled together to provide high power output. This is implemented in the manner discussed with reference to FIGS. 1a and 1b.

The improvement provided by the present invention is that modified switching circuitry is provided that (1) permit the extra amplifier channels 20a to be switched into the circuit if other amplifier channels 20a fail, as is the case with the prior system, and (2) also provides the capability to switch an unused amplifier channel 20a into the circuit to provide a communication channel between the corresponding output and input of the input and output multiplexers 11, 15 that is normally provided by the "coupled" amplifier channel 20a. The unused amplifier channel 20a that is switched into the circuit is typically the corresponding amplifier channel 20a of the other redundancy ring 10. However, this need not be the case, in that any of the unused amplifier channels 20a may be switched into the circuit to provide the communication path. Selection of the appropriate amplifier channel 20a is typically a function of design choice, taking into account the power availability, loading, and traffic demand.

The present invention thus provides the capability to use previously unused multiplexer channels by switching in a single amplifier channel 20a or combined pair of traveling wave tube amplifiers, such as from a different TWT redundancy ring 10, for example. The aspect of the present invention provides added flexibility and a simplicity in the design that "backfills" the unused multiplexer channels.

The switching circuitry permits extra amplifier channels 20a to be switched into the circuit if other amplifier channels 20a fail, and provides the capability to switch an unused amplifier channel into the circuit to provide a communication channel between the corresponding output and input of the input and output multiplexers 11, 15 that is normally provided by the "coupled" amplifier channel 20a when operating in high power mode. The unused amplifier channel 20a that is switched into the circuit is typically the corresponding amplifier channel of the other redundancy ring 10. However, this need not be the case, in that any of the unused amplifier channels 20a may be switched into the circuit to provide the communication path, subject to power, loading, and traffic demand.

Specific modifications to the conventional 12-for-8 redundancy rings 10 shown in FIGS. 1a and 1b to arrive at the system 30 of FIGS. 2a and 2b are as follows. The modifications to the conventional TWT redundancy rings 10 are realized by changing the switch type for switches 12a labeled A-H in FIGS. 1a and 1b from coaxial S switches 12a to coaxial T switches and changing the switch type for switches 16a labeled I-P in FIGS. 1a and 1b from waveguide C switches to waveguide R switches. Four additional pieces of coaxial cable are used to connect the new coaxial T-switches together and four additional pieces of waveguide are used to connect the new R-switches together. With these modifications, TWT amplifiers 26 from one redundancy ring 10 can be used to "backfill" the unused channels 20a in the output multiplexer 15 coupled to the other redundancy ring 10. This configuration adds flexibility that allows configuration of the TWT amplifiers on board a spacecraft and also maintain a 12-for-8 TWT redundancy, for example, in both TWT redundancy rings 10.

Thus, improved redundancy ring communication apparatus has been disclosed. It is to be understood that the above-described embodiment is merely illustrative of some of the many specific embodiments that represent applications of the principles of the present invention. Clearly, numerous and other arrangements can be readily devised by those skilled in the art without departing from the scope of the invention.

What is claimed is:

1. Communication apparatus comprising:

an input multiplexer for receiving multiplexed input signals at an input and for outputting a plurality of individual signals at different frequencies at a plurality of outputs thereof;

an output multiplexer having a plurality of inputs and an output;

a first plurality of selectively interconnected and controllable switches that are respectively coupled to the outputs of the input multiplexer;

a second plurality of selectively interconnected controllable switches that are respectively coupled to the plurality of inputs of the output multiplexer;

a plurality of amplifier channels, comprising normally used amplifier channels and redundant amplifier channels, that each comprise an amplifier for amplifying signals coupled thereto, and wherein the amplifier channels are coupled between corresponding switches of the first and second pluralities of controllable switches and provide communication channels between the corresponding outputs and inputs of the input and output multiplexers so that each communication channel operates independently, and wherein the amplifier channels further comprise means for selectively coupling signals from a selected output of the input multiplexer corresponding to a selected communication channel to both amplifiers of paired amplifier channels and for combining amplified output signals from the amplifiers of the pair of amplifier channels to provide a high power output for the selected communication channel; and a controller, coupled to each of the switches and means for selectively coupling signals, for selectively setting the switches to (1) route selected signals through independent communication channels, (2) route a selected signal through the pair of amplifier channels to provide a high power output for the selected communication channel, (3) route a selected signal through a redundant communication channel in the event of failure of another communication channel, and (4) route the signal of the normally unused communication channel that is normally amplified by the second amplifier of the paired amplifier channels operating in high power mode through an unused amplifier channel to provide a communication channel for the signal of the normally unused communication channel.

2. The communication apparatus of claim 1 wherein the amplifiers comprise traveling wave tube amplifiers.

3. The communication apparatus of claim 1 wherein the switches comprise coaxial T switches.

4. The communication apparatus of claim 1 wherein the switches comprise waveguide R switches.

5. The communication apparatus of claim 1 further comprising a plurality of channel preamplifiers respectively disposed between outputs of the input multiplexer and the plurality of amplifier channels.

6. Communication apparatus comprising:

an input multiplexer for receiving multiplexed input signals at an input and for outputting a plurality of individual signals at different frequencies at a plurality of outputs thereof;

an output multiplexer having a plurality of inputs and an output;

a plurality of amplifier channels, comprising normally used amplifier channels and redundant amplifier channels, that each comprise an amplifier for amplifying signals coupled thereto, and wherein the amplifier channels are coupled between corresponding switches of the first and second pluralities of controllable switches and provide communication channels between the corresponding outputs and inputs of the input and output multiplexers so that each communication channel operates independently, and wherein the amplifier channels further comprise means for selectively coupling signals from a selected output of the input multiplexer corresponding to a selected communication channel to both amplifiers of paired amplifier channels and for combining amplified output signals from the amplifiers of the pair of amplifier channels to provide a high power output for the selected communication channel;

switching circuitry coupled between the multiplexers and the plurality of amplifier channels; and a controller, coupled to the switching circuitry, for selectively (1) routing selected signals through independent amplifier channels, (2) routing a selected signal through the, pair of amplifier channels to provide a high power output for the selected communication channel, (3) routing a selected signal thorough a redundant communication channel in the event of failure of another communication channel, and (4) routing the signal of the normally unused communication channel that is normally amplified by the second amplifier of the paired amplifier channels operating in high power mode through an unused amplifier channel to provide a communication channel for the signal of the normally unused communication channel.

7. The communication apparatus of claim 6 wherein the amplifiers comprise traveling wave tube amplifiers.

8. The communication apparatus of claim 6 wherein the switching circuitry comprises coaxial T switches.

9. The communication apparatus of claim 6 wherein the switching circuitry comprises waveguide R switches.

10. The communication apparatus of claim 6 further comprising a plurality of channel preamplifiers respectively disposed between outputs of the input multiplexer and the plurality of amplifier channels.

* * * * *